United States Patent [19]
VanBuskirk

[11] Patent Number: 5,841,387
[45] Date of Patent: Nov. 24, 1998

[54] METHOD AND SYSTEM FOR ENCODING A DIGITAL SIGNAL

[75] Inventor: James E. VanBuskirk, Richmond, Tex.

[73] Assignee: Texas Instruments Incorporated, Dallas, Tex.

[21] Appl. No.: 116,233

[22] Filed: Sep. 1, 1993

[51] Int. Cl.[6] ............... H03M 1/00; G11B 5/02
[52] U.S. Cl. .......... 341/155; 341/110; 341/144; 360/32
[58] Field of Search ............ 341/155, 157, 341/110, 123, 144; 360/32; 84/1.01, 625; 375/106; 370/100

[56] References Cited

U.S. PATENT DOCUMENTS

| | | | |
|---|---|---|---|
| 4,649,783 | 3/1987 | Strong et al. | 84/1.01 |
| 4,729,123 | 3/1988 | Wheen | 370/100 |
| 4,763,207 | 8/1988 | Podolack et al. | 360/32 |
| 4,772,873 | 9/1988 | Duncan | 341/110 |
| 4,856,030 | 8/1989 | Batzer et al. | 375/106 |
| 4,893,316 | 1/1990 | Janc et al. | 375/44 |
| 5,241,129 | 8/1993 | Muto et al. | 84/625 |

*Primary Examiner*—John W. Cabeca
*Assistant Examiner*—Marlon T. Fletcher
*Attorney, Agent, or Firm*—Richard L. Donaldson; W. James Brady, III; Warren L. Franz

[57] ABSTRACT

A method and system of representing a signal is disclosed herein. A digital representation of an analog signal is received by a bandwidth detection circuit 14. The digital signal typically, but not necessarily, comes from a analog-to-digital converter 12. The a bandwidth of the signal is determined. The bandwidth is compared to a selected threshold bandwidth. A selected portion of the digital representation is stored in a memory unit 16. The selected portion is determined by a result of the comparison step. A code word is also generated by the bandwidth detection circuit 14 and stored in the memory circuit 16. The original analog signal can be recreated with a decode circuit 20.

15 Claims, 12 Drawing Sheets

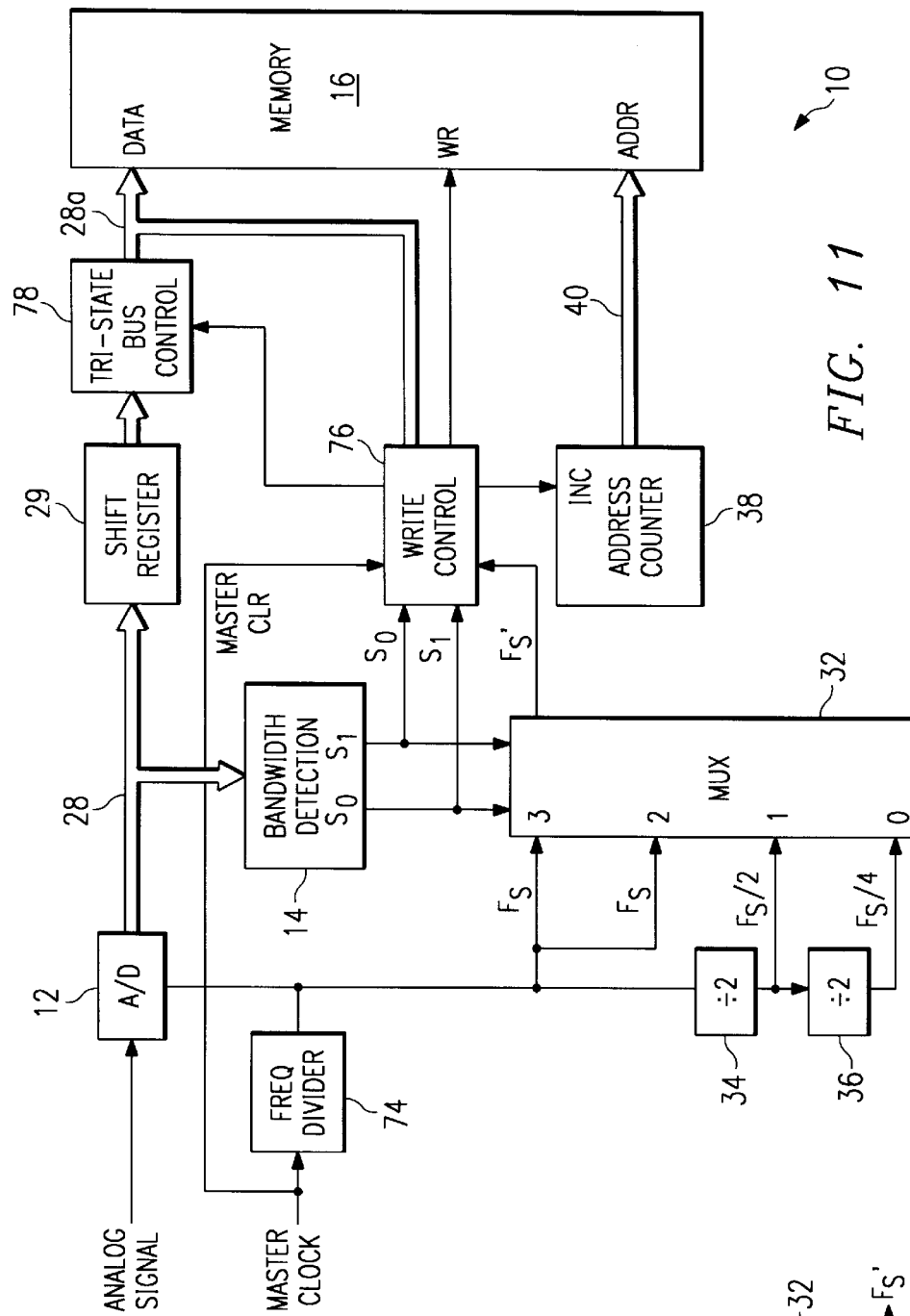
*FIG. 11*
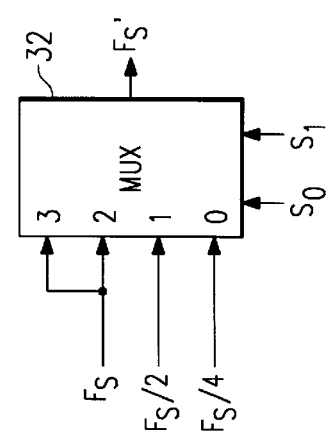
*FIG. 10*
| $S_1$ | $S_0$ | $F_S'$ |
|---|---|---|
| 0 | 0 | $F_S/4$ |
| 0 | 1 | $F_S/2$ |
| 1 | 0 | $F_S$ |
| 1 | 1 | $F_S$ |
*FIG. 9*

| FLAG 1 | FLAG 2 | FLAG 3 | $S_1(t+1)$ | $S_0(t+1)$ | $S_1(t+2)$ | $S_0(t+2)$ |
|---|---|---|---|---|---|---|
| 0 | 0 | 1 | 1 | 1 | 0 | 0 |
| 0 | 1 | 0 | 1 | 1 | 0 | 1 |
| 1 | 0 | 0 | 1 | 1 | 1 | 0 |
| 0 | 0 | 0 | $S_1(t)$ | $S_0(t)$ | $S_1(t)$ | $S_0(t)$ |

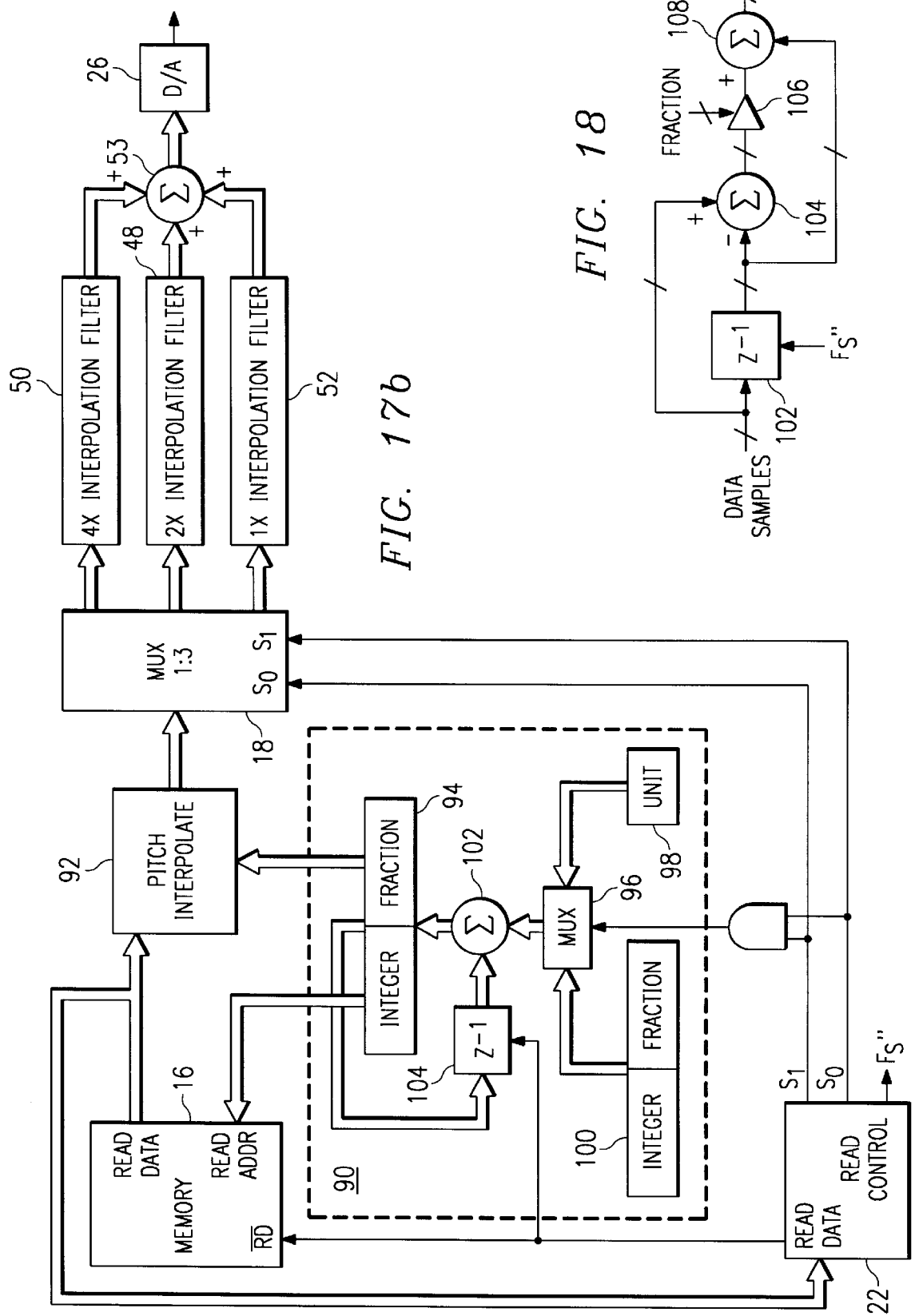

METHOD AND SYSTEM FOR ENCODING A DIGITAL SIGNAL

FIELD OF THE INVENTION

This invention generally relates to electronic systems and more specifically to a method and system for encoding a digital signal.

BACKGROUND OF THE INVENTION

Down through the ages, people have devised numerous methods for communicating their thoughts and needs to others. In primitive days, communication took place through speech, gestures, and graphical symbols. In later times, systems employing electrical signals provided a fast and easy means to communicate and store information. Today, electrical systems span the entire world linking together voice and other audio information, text, pictures, and a variety of other information.

As computer technology advances, a great number of applications are being performed with digital (or discrete) signals as opposed to analog signals. Digital signals can be manipulated by computer systems for many advantageous applications. However, some types of signals, such as voice or music, must also be available as analog signals. Accordingly, encoding techniques have developed to convert analog signals to digital signals and vice versa.

One such coding technique is pulse code modulation or PCM. In PCM, the analog signal is sampled and each of these samples is quantized using a uniform quantizing rule. Each of the quantized output levels is arbitrarily assigned a level number and these level numbers are encoded in binary form. Using this technique, an analog signal can be represented by a series of digital words. These digital words can then be stored in standard memory devices or processed using standard microprocessors and other digital logic. The signal can then always be converted back to an analog signal.

SUMMARY OF THE INVENTION

Digital PCM (pulse code modulation) encoded signal recording, playback, and processing require an electronic system with high speed memory access, large data memory size, and a high bandwidth communication medium. In the context of digital sample based music synthesis, the problem is magnified due to the need for simultaneous access to multiple channels of multiple musical instrument or sound data samples which may be pitch interpolated or otherwise processed in real time. Thus, the cost of hardware to support real time, multi timbral, polyphonic, sampled sound based music synthesis is very expensive. This high cost is largely due to the need for large, high speed memory and a high bandwidth bus interface. A professional quality sound sample based music synthesizer cannot utilize host system memory from an ISA expansion card due to ISA bus bandwidth and Host system memory access throughput limitations. Such a system must have its own memory bank and memory interface local to the expansion card.

Accordingly, improvements which overcome any or all of the problems are presently desirable.

Other objects and advantages will be obvious, and will in part appear hereinafter and will be accomplished by the present invention which provides a method and system for encoding a digital signal.

A method of representing a signal is disclosed herein. A digital representation of an analog signal is received by a bandwidth detection circuit. The digital signal typically, but not necessarily, comes from a analog-to-digital converter. For example, the digital representation may be generated by a computer or retrieved from a memory circuit (e.g., an electronic memory or a magnetic or optical disk). The bandwidth of the signal is determined. The bandwidth is compared to a selected threshold bandwidth. A selected portion of the digital representation is stored in a memory unit. The selected portion is determined by a result of the comparison step. A code word is also generated by the bandwidth detection circuit and stored in the memory circuit. This method of representing a signal may be referred to as adaptive sampling.

A system for encoding the analog signal is also described. An analog-to-digital converter converts the analog signal to a digital signal which includes a sequence of samples. A bandwidth detection circuit determines the bandwidth and compares the bandwidth to a selected threshold bandwidth. The bandwidth detection circuit also generates a control signal based on a result of the comparison. A memory circuit stores selected ones of the sequence of samples. These selected ones are selected based upon the control signal generated by the bandwidth detection circuit.

In addition, a system for decoding a digital representation of an analog signal is described in this patent. The digital representation is stored in a memory unit. Address circuitry generates an address to be coupled to an address input of the memory unit. A read control circuit reads a control word within the digital representation and determines the appropriate sample rate. In addition, a digital-to-analog converter receives the digital representation as well as a clocking signal at the sample rate. The digital-to-analog converter then converts the digital representation to the analog signal.

The present invention provides a method which is computationally efficient and which provides a high quality output. The adaptive sampling process is well suited for applications that require high computational efficiency and moderate compression ratios. Sample based music synthesis is one such application.

BRIEF DESCRIPTION OF THE DRAWINGS

The above features of the present invention will be more clearly understood from consideration of the following descriptions in connection with accompanying drawings in which:

FIG. 9 is a state table which illustrates a possible implementation of the selection of desired frequency;

FIG. 10 is a circuit to implement the state table of FIG. 9;

FIG. 11 is a more detailed block diagram of the encode circuit of FIG. 7;

FIGS. 17a and 17b are schematic diagrams of a pitch interpolated embodiment of the present invention;

FIG. 18 is a schematic diagram of a preferred embodiment pitch interpolation circuit;

Corresponding numerals and symbols in the different figures refer to corresponding parts unless otherwise indicated. The reference numbers and corresponding elements are summarized in Table 1 at the end of the specification.

DETAILED DESCRIPTION OF PREFERRED EMBODIMENTS

Figure 1:
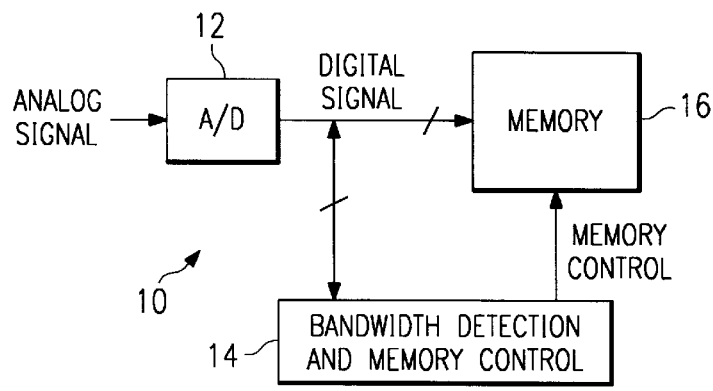
FIG. 1 is a block diagram of a preferred embodiment encode circuit.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

The following is a description of the system and method of the present invention. A general description of the present invention will be described first followed by a description a preferred embodiment. Some specific examples will then be discussed along with some of the modifications which can be used.

In one aspect, this patent describes a process which incorporates digital signal representation and reconstruction. This method uses a time varying sample frequency which adapts to and is roughly proportional to the perceived maximum frequency range of the source signal at any given point in time and operates within the context of a continuous signal representation. The speed at which memory is accessed is thus decreased during any time "frame" during which the perceived bandwidth of the signal is less than a maximum perceived bandwidth. The maximum perceived bandwidth is the highest allowed bandwidth for any time frame from the entire length of the signal. In general, a frame is a fixed period of time whose length is less than the entire amount of time required to represent the signal. Each frame is large enough to contain energy spectra for the frequency bands of interest. Thus, the amount of memory required to represent a signal as well as the required bandwidth of the communication medium is reduced by applying this process during any "frame" which does not have perceivable spectral content in the highest relative frequency bank.

In the context of sampled sound based music synthesis, the bandwidth of the bus which connects the memory to the synthesis engine as well as the memory access rate is further reduced by the application of "spectral content knowledge" and "sample storage redundancy" for "voices" in the context of dynamic voice allocation. Continuous bus bandwidth is reduced by the memory read control process. In the PC environment, the process allows for the use of PC system memory (e.g., DRAM) for sample sound storage. The process reduces the memory access throughput enough to allow for an ISA expansion card to address and utilize host system memory for sample sound storage, yet maintain professional synthesizer quality and voice polyphony levels. Thus, the process saves the cost of memory which would be required to reside local on the PC expansion card due to ISA bus bandwidth and Host system memory access throughput limitations.

Thus, one goal of the present invention is to reduce digital audio waveform data storage requirements with minimal computational or hardware support and minimal signal quality degradation.

This goal can be accomplished using a complementary encode/decode approach which utilizes a dynamic signal sampling frequency which is proportional to the perceivable bandwidth of the signal. The process is different than PCM representation in that the sample frequency varies over time for record and playback.

A general block diagram of a preferred embodiment encode circuit 10 is illustrated in FIG. 1. An analog signal is received at analog-to-digital (A/D) converter 12 which converts this signal into a digital signal. In a preferred embodiment, the digital signal is quantized into 16 bits. However, the number of digital bits is determined by design choice of circuit and is not critical to the present invention.

The digital signal is provided to a bandwidth detection circuit 14. The bandwidth detector circuit determines the bandwidth of the signal and from this information generates a memory control signal. The memory control signal is applied to memory circuit 16. A portion of the digital signal is then stored in the memory circuit 16 along with a control data word. The control data word will be used by the decode circuit (e.g. as shown in FIG. 2) to determine the portion of the signal which was stored so that the full signal may be recreated.

In an alternative embodiment, not illustrated, the analog signal can be provided to the bandwidth detection circuit 14 prior to being converted by A/D converter 12. This circuit can be used if the bandwidth detector within circuit 14 operates with an analog signal.

Figure 2:
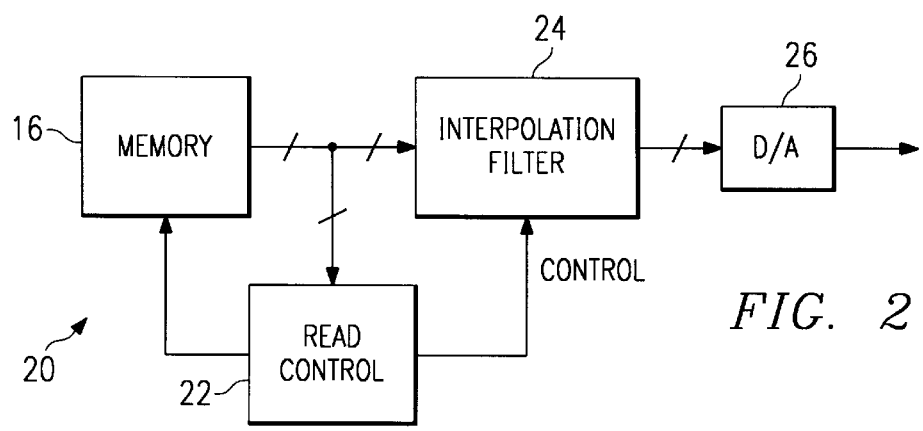
FIG. 2 is a block diagram of a preferred embodiment decode circuit.

FIG. 2 illustrates a general block diagram of a preferred embodiment decode circuit 20. The data samples and control words which were stored in memory circuit 16 are available to read control circuit 22 and interpolation filter 24. The read control circuit 22 is a circuit which determines which portion of the original signal was stored in the memory. The interpolation filter 24 then utilizes this information to restore the full signal. The signal can then be converted to a digital signal using digital-to-analog converter (D/A) 26. In one embodiment, the functions of the interpolation filter 24 and D/A converter 26 are combined in the D/A converter 26 (as in the circuit of FIG. 6).

Figure 3A:
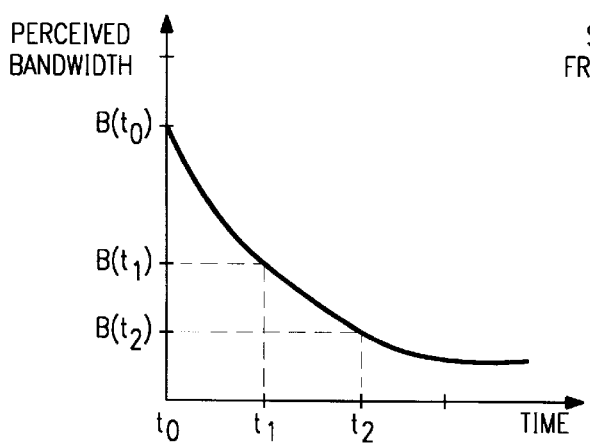
FIG. 3a is a graph of the bandwidth of an exemplary signal plotted over time and 3b is a graph of the corresponding sampling rate over time for one embodiment of the present invention.
Figure 3B:
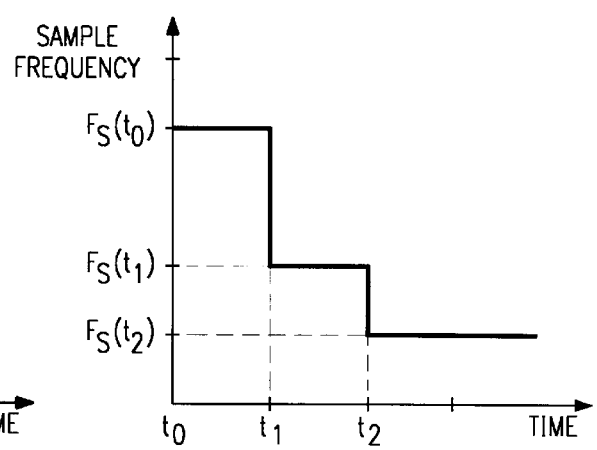
Figure 4:
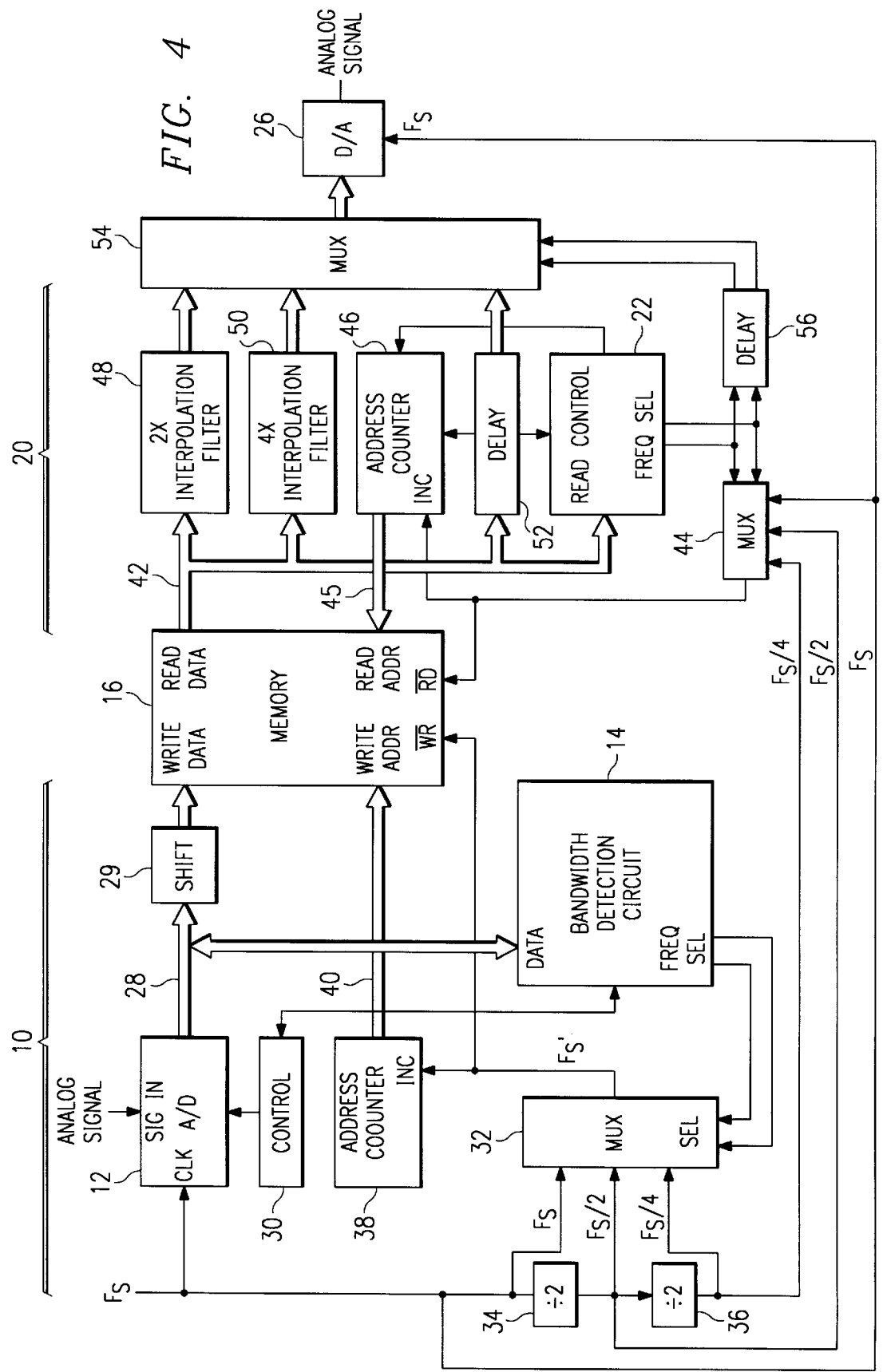
FIG. 4 is a block diagram of a system of the present invention.
Figure 5:
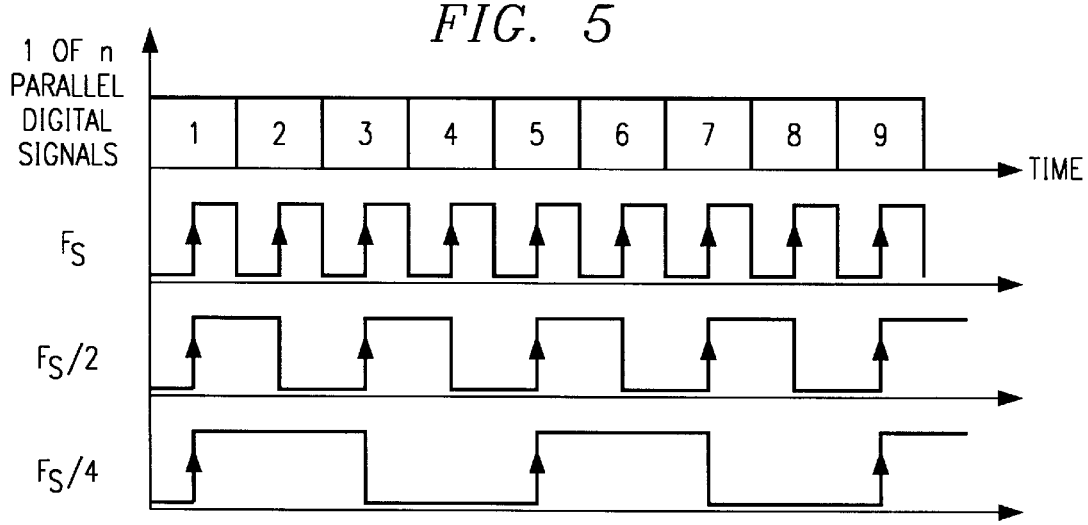
FIG. 5 is a timing diagram used to illustrate the operation of the system of FIG. 4.
Figure 6:
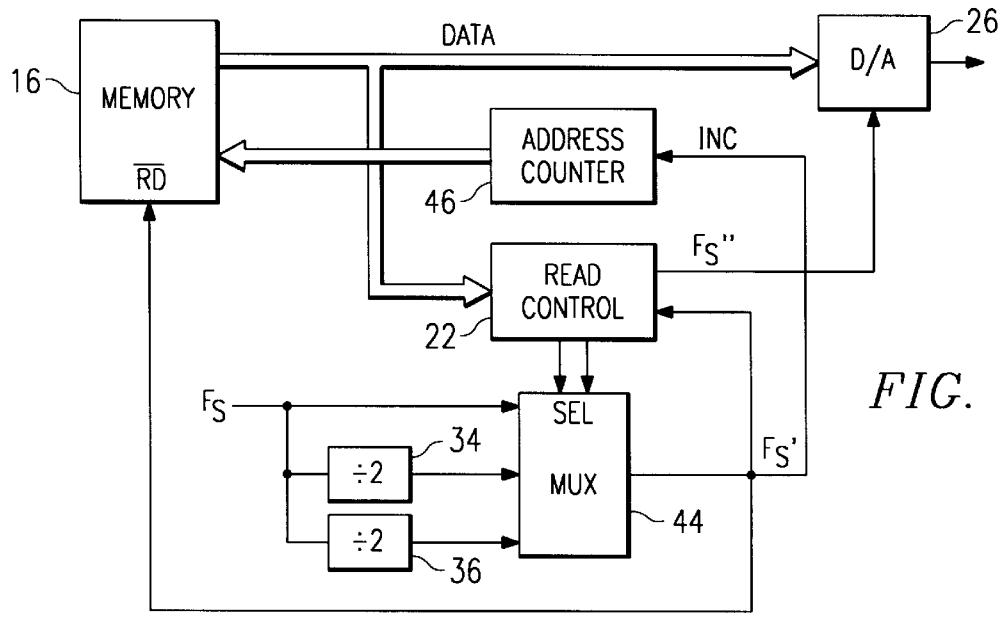
FIG. 6 is a block diagram of an alternative embodiment decode circuit.
Figure 20:
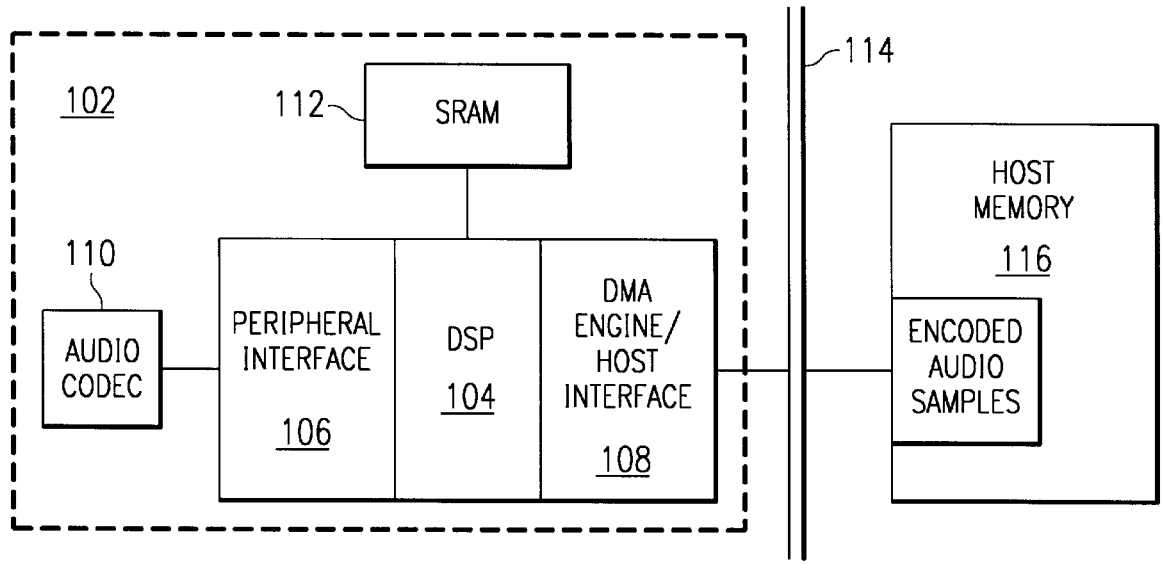
FIG. 20 is a block diagram of a PC system which utilizes the present invention.
Figure 21:
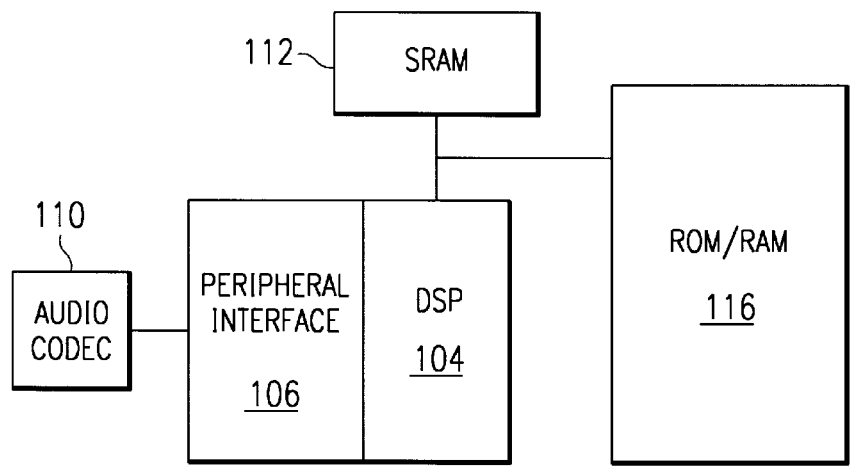
FIG. 21 is a block diagram of a dedicated sample memory system which utilizes the present invention.

The broad concepts of the present invention will be better understood by looking to a specific example. FIGS. 3a and 3b will be used to demonstrate how the preferred embodiment can be utilized. FIG. 4 provides a block diagram of a preferred embodiment circuit and FIG. 6 shows a possible modification to the decode circuit of FIG. 4. FIG. 5 provides a timing diagram which is useful to understand the operation of the system of FIG. 4. FIGS. 7–12 provide a more detailed look at exemplary encode circuitry and FIGS. 13–16 provide a more detailed look at exemplary decode circuitry. An alternate embodiment is described in conjunction with FIGS. 17–19 which illustrate circuitry for a pitch interpolated embodiment. Finally, FIGS. 20 and 21 illustrate two possible systems which may utilize the present invention.

The preferred method of sampling will be described with use of an example signal whose bandwidth over time is illustrated in FIG. 3a. The perceived bandwidth of the signal in question is plotted as a function of time. In this example, three sampling frequencies will be used as illustrated in FIG. 3b. It should be understood however that any number (greater than one) of sampling frequencies can be used and the use of only three frequencies is illustrative.

From the Nyquist theorem, it is known that $F_s \geq 2B$ where $F_s$ is the sampling rate and B is the bandwidth. For the case illustrated, we can assume that $F_s(t_0)=2B(t_0)$, $F_s(t_1)=2B(t_1)$, and $F_s(t_2)=2B(t_2)$. If oversampling is desired, these equations can be varied accordingly.

The bandwidth detector circuit 14 determines the appropriate selection of sampling frequency and controls the storage of the signal in memory. In the example, the highest necessary sampling rate is $F_s(t_0)$. In prior art systems, all time portions (frames) of the signal are stored at this frequency to ensure the integrity of the recreated analog signal. In the present invention, on the other hand, the signal is checked in real time and only the number of samples which are needed to recreate the signal are stored.

In this example, the second sampling rate $F_s(t_1)$ is half the highest sampling rate (i.e., $F_s(t_1)=\frac{1}{2} F_s(t_0)$). When the bandwidth becomes low enough so that the lower sampling rate can be used to recreate the entire signal, the sampling rate will be lowered. In this example, the rate is lowered to half the higher value. During the time frames in which the bandwidth is smaller, only half the memory will be used since only half the samples are being stored. In other words, the A/D converter 12 generates a number of digital samples but only a portion, e.g. every other one, of these samples are stored in the memory 16. The portion of the signal to be stored is determined by the bandwidth detector circuit 14 which controls the memory through the memory control signal, as illustrated in FIG. 1.

The bandwidth detector circuit 14 also generates a control word which is stored in the memory along with the data signals. The control is used to indicate the sampling rate to the decode circuit so that the original signal can be recreated. In the preferred embodiment, a control word is generated and stored whenever the sampling rate changes. During the decode operation, each word is checked to see if it is a data word or a control word. If a control word is found, the sampling rate will be adjusted accordingly. In an alternative embodiment, a control word is generated for each time frame. If this scheme is used with pitch interpolated signals, however, additional circuitry may be necessary since the number of samples in each frame may change as a signal is pitch interpolated.

Many criteria could be used to generate the control word. One method of coding the control word is to use the highest possible positive number as a code to increment the sampling frequency $F_s$ to the next highest level and to use the lowest possible negative number as a code to decrement the sampling frequency $F_s$ to the next lowest level. Using this method, the number of levels which quantize the analog signal is reduced by two. For example, an eight bit code using this technique will have 254 signal levels and two control words (as opposed to 256 signal levels when a constant sampling rate is used).

In an alternative embodiment, a different control word can be associated with each sampling rate. For example, if four sampling rates are used then the decode circuit would search for one of the four designated control words.

In yet another embodiment, three control words are used to indicate increment sample rate, decrement sample rate and use highest sample rate. This scheme would save having a control word for each possible sample rate (if more than three choices are available). This scheme would also provide for a signal in which the bandwidth goes up abruptly. By using the highest sampling rate, the integrity of the recreated signal is not jeopardized.

If only two sample rates are used, a single control word could be used to indicate a toggle between the two rates.

A more detailed look at a preferred embodiment system will now be described with reference to FIG. 4. The reference numerals used for the elements of FIG. 4 are summarized in Table 1.

Referring now to FIG. 4, an analog signal can be applied to the signal input SIG IN of an analog-to-digital (A/D) converter 12. A clocking signal is also applied to the clock input CLK of A/D converter 12. In the preferred embodiment, the clocking signal is provided at the highest necessary sampling frequency $F_s$.

The A/D converter 12 has a parallel output which is coupled to data bus 28. The data bus 28 provides the digital bits to a WRITE DATA input of memory unit 16 and to a DATA input of bandwidth detection circuit 14.

A shift register 26 is included in the data path of data bus 28 to ensure proper timing of the signals. The shift register 29 delays the data samples as appropriate to compensate for delays produced with the bandwidth detection circuit 14.

The bandwidth detection circuit 14 generates a frequency select signal FREQ SEL based upon the perceived bandwidth. In the case where three sampling frequencies are used, two control lines are coupled to the select input SEL of multiplexer (MUX) 32. Clocking signals at each of the selected sampling frequencies are coupled to the inputs of multiplexer 32. A more detailed illustration of a preferred embodiment bandwidth detection circuit 14 is discussed with reference to FIGS. 7–12.

In this example, three sampling frequencies ($F_s$, $F_s/2$, $F_s/4$) are used. This case is illustrated in FIG. 3b. The highest frequency signal $F_s$ is coupled to one input of multiplexer 32 and also to an input of frequency divider circuit 34. The signal output from frequency divider circuit 34 has a frequency half that of the input signal $F_s$. This signal $F_s/2$ is coupled to a second input of multiplexer 32 and to frequency divider circuit 36. Signal $F_s/4$ is output from frequency divider circuit 36 and has a frequency which is one fourth of the frequency $F_s$. If additional sampling frequencies are required, then this method of halving the signal frequencies can be repeated. (Of course, if more than three sampling frequency choices are required, an additional frequency select control signal must be generated by the bandwidth detection circuit 14).

Although illustrated with circuitry to give frequencies which are one-half and one-fourth the maximum frequency, the system of FIG. 4 would work equally well with any other selection of sample frequencies. The frequency divider circuits 34 and 36 can comprise any arbitrary frequency multiplier. Of course, the threshold bandwidths which are used by bandwidth detection circuit 14 would also need to be adjusted accordingly. To simplify the timing considerations, it is preferable to divide the frequency by an integer. For example, if the system has two frequencies $F_s$ and $F_s/3$, all samples will be saved for high bandwidth signals and one out of three samples will be saved for lower bandwidth signals.

The output $F_s'$ of multiplexer 32 is coupled to the increment input INC of address counter 38 and also to the write input WR⁻ of memory unit 16. The address counter 38 has an output which is coupled to address bus 40. Address bus 40 provides the write address WRITE ADDR for memory unit 16.

It should be noted that the specific connections illustrated are provided to demonstrate the most relevant finctional connections of each of the elements. In designing an actual system, the connections will be made in accordance with specific input and output pins of the appropriate chips (or simply the inputs and outputs if the circuit is built on a single chip).

The operation of the encode portion of the system illustrated in FIG. 4 will be described with reference to the timing diagram illustrated in FIG. 5. The first signal illustrated represents one of a number n (e.g., 8 or 16) of parallel digital signals generated by A/D converter 12 and placed on data bus 28. As previously discussed, these n bits represent one sample of the analog input signal.

The second signal represents the clocking signal at the highest sampling rate $F_s$. When the highest rate is selected, this signal will be output from multiplexer 32. If we assume that the memory writes on the rising edge of a pulse input to the write WR⁻ input, then each of the nine samples will be stored in the memory. If, however, the bandwidth detection circuit selects a lower sample rate via the select lines of multiplexer 32, then the clocking signal $F_s/2$ will be output from the multiplexer 32 and applied to the write WR input of memory 16. In this case, only samples 1, 3, 5, 7 and 9 will be saved. In other words, only a portion of the original signal is actually stored in memory. By the same rationale, if clocking signal $F_s/4$ is selected, only samples 1, 5 and 9 will be saved in memory. Since the additional samples are not necessary to recreate the original analog signal, the amount of memory necessary has been reduced without losing any performance.

Returning now to FIG. 4, the decode portion of the system will be described. Memory unit 16 is coupled to data bus 42 which provides the digital signal stored in memory to read control circuit 22. The read control circuit 22 reads each word from memory 16 to determine if a control word is present. If a control word is found, the read control circuit 22 adjusts the frequency select signal FREQ SEL which chooses the desired frequency at multiplexer 44.

The read control circuit is also coupled to address counter 46. The address counter 46 is incremented at the appropriate sampling frequency by the signal from the multiplexer 44. The address counter 46 generates the read address READ ADDR for memory unit 16. The address counter 46 may comprise circuitry which is more complex than a simple counter if the application so requires. One example of more complex addressing circuitry is discussed with respect to the pitch interpolation embodiment of FIG. 17*a*.

The data bus 42 is also coupled to the inputs of 2x interpolation filter 48, 4x interpolation filter 50 and delay circuit 52. The interpolation filters 48 and 50 recreate the digital samples that were not saved in the memory. For example, when the $F_s/2$ sampling rate was selected during the discussion of FIG. 5, only samples 1, 3, 5, 7 and 9 were saved. The interpolation filter 48 would recreate samples 2, 4, 6 and 8 based upon those samples that were saved. This function can be performed since the signal did not change appreciably in that time (for if it had, the higher sampling rate would have been selected).

The delay circuit 52 is provided for signals for which all the samples were saved in memory. Since all the samples were saved, there is nothing to interpolate. In the abstract, the delay circuit 52 can be thought of as a 1x interpolation filter. The delay circuit 52 may comprise a shift register or a low pass filter in which case $F_c=F_s/2$ (where $F_c$ is the cutoff frequency).

The outputs of each of the interpolation filters 48, 50 and 52 are provided to multiplexer 54 which selects the proper signal based upon the select input SEL which was generated by read control circuit 22. The select signals are delayed in delay circuit 56 to ensure the appropriate timing.

Figure 4A:
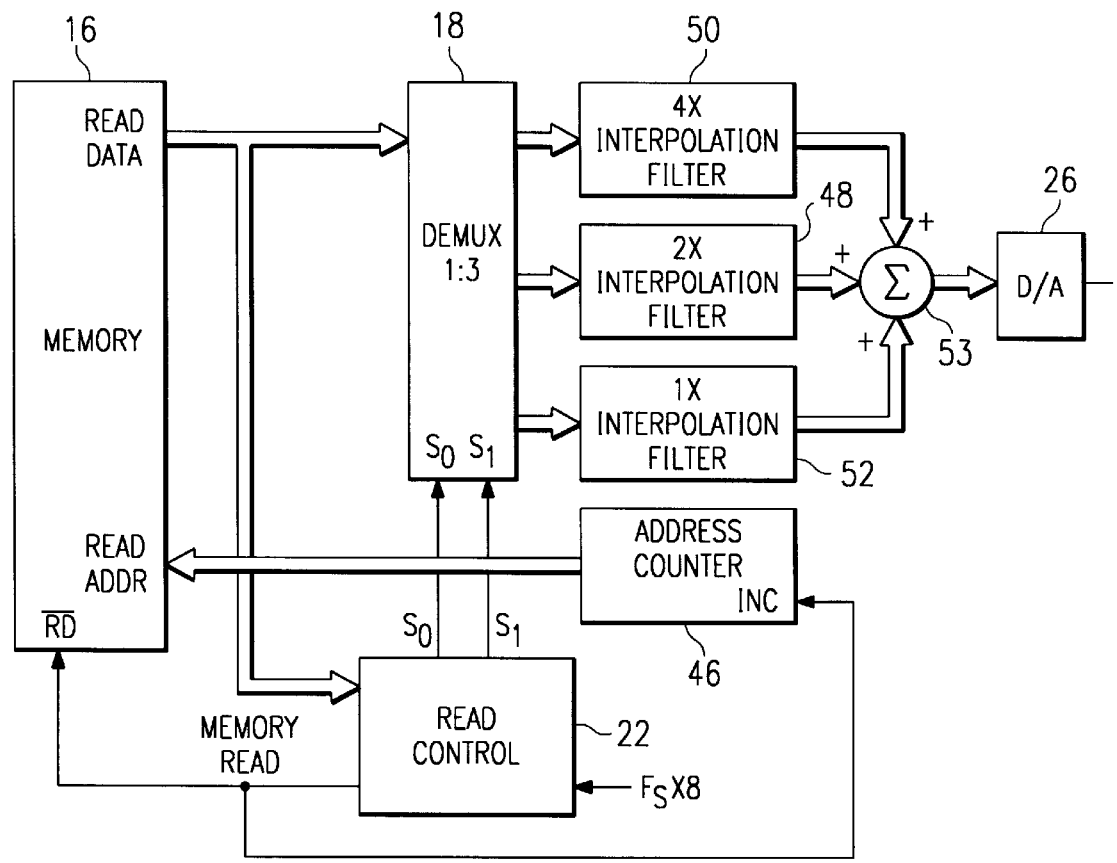
FIG. 4a is a block diagram of a variation of the system of FIG. 4.

It may be preferable to connect a multiplexer 18 to the input side of the interpolation filters 48, 50 and 52 and sum the filter outputs in summer 53 as illustrated in FIG. 4*a*. This embodiment may simplify state variable timing and buffer management within the interpolation filters 48, 50 and 52.

The digital signal output by multiplexer 54 is provided to the input of digital-to-analog converter 26. A clocking signal at a frequency of $F_s$ is also provided for the timing of the converter. An analog signal is output from D/A converter 26 which resembles the original analog signal which had been input to A/D converter 12.

The system illustrated in FIG. 4 is operable to read one signal at the same time it writes out a different signal (assuming the memory 16 can operate busses 28 and 40 at the same time it operates busses 42 and 43). If this option is not required, some of the elements can be combined. For example, the functions of multiplexers 32 and 44 can be performed within a single multiplexer. In this embodiment, the frequency select signals generated by bandwidth detection circuit 14 and read control circuit 22 would need to be tri-stated. As a second example, the functions of address counters 38 and 46 could be performed with a single counter.

An alternative embodiment decode circuit 20 is illustrated in FIG. 6. In this embodiment, the selected sampling frequency $F'_s$ is applied to the read control circuit 22 as well as to the read input RD of memory unit 16 and the increment input INC of address counter 46. The read control circuit 22 generates a sample frequency signal $F_s"$ which is applied to the clocking input of D/A converter 26. The read control circuit passes through the appropriate timing signal $F_s'$ and also ensures that the D/A converter 26 does not convert a control word. This embodiment eliminates the need for interpolation filters 48 and 50 (and therefore delay 52) since the D/A converter will interpolate as appropriate.

The embodiment illustrated in FIG. 6 should work fine for a low-cost system which does not need professional quality. Many D/A converters will produce noise artifacts when the sampling frequency is changed "on the fly". However, some D/A converters will support a variable sampling rate. It is preferable that one of these converters be used. In addition, analog reconstruction filters could be used instead of digital filters.

A more detailed discussion of the preferred embodiment bandwidth detection circuit will now be discussed with reference to FIGS. 7–12.

Figure 7:
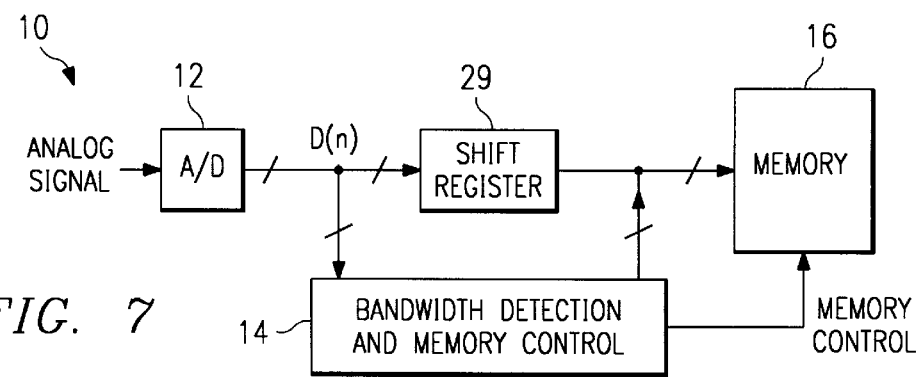
FIG. 7 is a block diagram of a preferred embodiment encoder circuit.

FIG. 7 illustrates a general block diagram of the preferred embodiment encode circuit 10. FIG. 7 is the same as FIG. 1 except that shift register 29 is included in the data path between A/D converter 12 and memory 16. The shift register 19 delays the data samples D(n) as appropriate to compensate for delays produced by the high pass filters and the frame delay as used by the RMS level detect process with bandwidth detection circuit 14.

Figure 8:
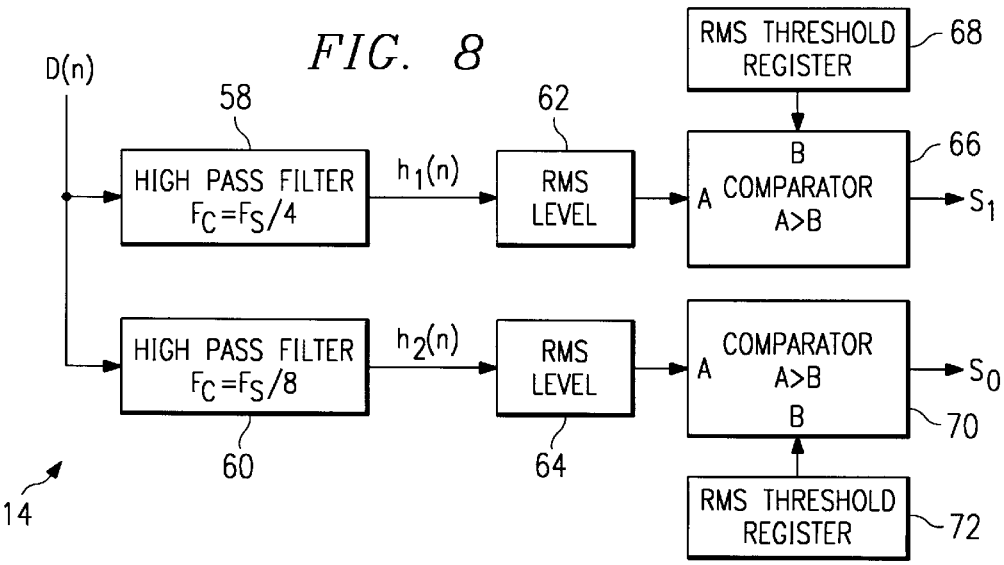
FIG. 8 is a preferred embodiment bandwidth detection circuit.

Referring now to FIG. 8, a preferred embodiment bandwidth detection circuit 14 is illustrated in block diagram form. The digital samples D(n) are applied to the inputs of both high pass filter 58 and high pass filter 60. The output of high pass filter 58 is coupled to the input of RMS level detector 62. Likewise, the output of high pass filter 60 is coupled to the input of RMS level detector 64. The output of RMS level detector 62 is coupled to the A input of comparator 66. The B input of comparator 66 comes from threshold register 68. Similarly, comparator 70 receives inputs from RMS level detector 64 and threshold register 72. The comparators 66 and 70 generate the frequency select signals $S_1$ and $S_0$, respectively.

The bandwidth detection circuit 14 monitors the energy level of selected frequency bands within the digital signal D(n) and generates a control signal $S_0$, $S_1$ that selects the time varying rate at which signal data values are written to memory.

The specific embodiment illustrated in FIG. 8 pertains to the example implementation discussed with respect to FIGS. 3a and 3b. The adaptive sampling process is not limited to only three data write rates even though each of the examples shows only three rates.

The high pass filters 58 and 60 remove the frequency bands below its respective cutoff frequency $F_c$. The cutoff frequencies have been chosen as $B(t_1)$ and $B(t_2)$ from FIGS. 3a and in accordance with the Nyquist theorem. The root-mean-square (RMS) average level for a frame of high pass filtered digital samples is computed (in detectors 62 and 64) and compared to the RMS threshold value representative of noticeable spectral content for frequency bands above $B(t_1)$ and $B(t_2)$, respectively. The RMS level can be calculated as $$RMS = \sqrt{\frac{1}{f} \sum_1^f h_x(n)^2}$$

where f is the frame size. In the preferred embodiment, f=256 but other values may also be used. R.M.S. is only one of many amplitude averaging processes that may be employed within adaptive sampling.

FIG. 9 illustrates a state table from which the proper sample rate $F'_s$ can be selected. If neither level detector 62 or 64 detects any substantial frequency spectra (i.e., $S_1$=0, $S_0$=0), the lowest sampling rate $F_s/4$ will be selected. If the low bandwidth detector 60 detects a signal but the higher bandwidth detector 58 does not (i.e., $S_1$=0, $S_0$=1), the middle sampling rate $F_s/2$ will be selected. In all other cases, the highest sampling rate $F_s$ will be selected. As previously mentioned, this concept can be expanded for more than three choices of sampling rate.

FIG. 10 illustrates the preferred embodiment circuit for implementing the state table of FIG. 9. A multiplexer 32 is utilized to select the desired frequency. Other methods of implementing the state table can also be used. One example would be to use logic gates, for example implementing the equation $$F'_s = (\overline{S_1} \cdot \overline{S_0} \cdot F_s/4) + (\overline{S_1} \cdot S_0 \cdot F_s/2) + S_1 \cdot F_s$$

Referring now to FIG. 11, a more detailed block diagram of encode circuit 10 is shown. The circuit of FIG. 11 is similar to the encode portion of FIG. 4 with a few modifications.

A master clock signal is input to frequency divider 74 which generates the highest frequency sample rate $F_s$. The frequency of the master clock signal should preferably be higher than $F_s$ so that the read control words can be written into memory without missing any samples.

The circuit of FIG. 11 also includes a write control circuit 76. The write control circuit 76 receives the master clock signal, the frequency select signals $S_0$ and $S_1$ and the selected clocking signal $F'_s$. The write control circuit 76 in turn generates the increment signal INC for address counter 38, the memory write signal WR for memory unit 46, the control word which is stored in memory via data bus 28a and bus control signal which is coupled to tri-state bus control circuit 78.

The write control logic 76 arbitrates the write data bus 28a to inject a control word into the stream of data to be written to memory 16. This control word precedes its respective frame of digital signal values and is written such that real time is maintained and no digital signal values are missed. The control word indicates that a write data rate change has occurred. Thus, its respective frame of data is written at the new data rate. In the preferred embodiment, the write control logic does not inject a control word between frames of data which are to be written at the same rate. In other embodiments, a control word may be written for each frame of data.

Figure 12:
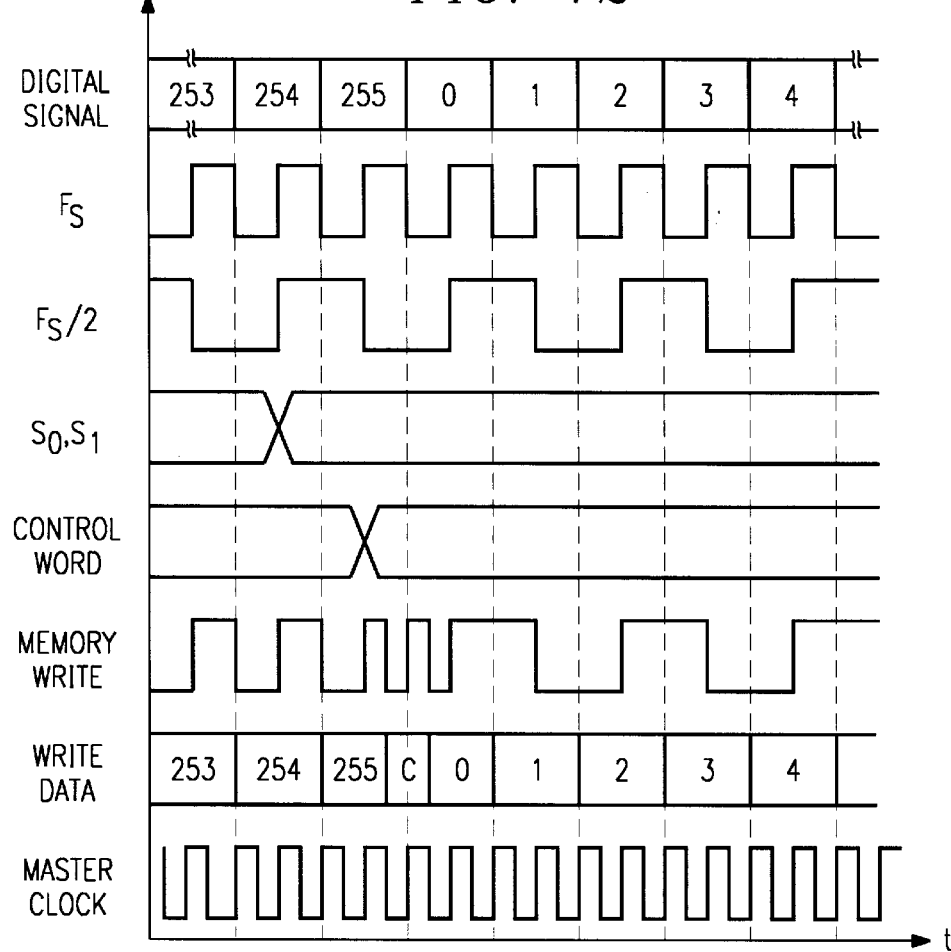
FIG. 12 is a timing diagram to demonstrate the operation of the preferred embodiment encode circuit.

The timing diagrams shown in FIG. 12 illustrates the arbitration of digital signal words and control words during a transition from a write data rate of $F_s$ to a write data rate of $F_s/2$. As shown in the figure, a control word C is written to memory between sample 255 of the first frame and sample 0 of the second frame.

A more detailed discussion of the read control circuit 20 will now be given with reference to FIGS. 13–17.

Figure 13:
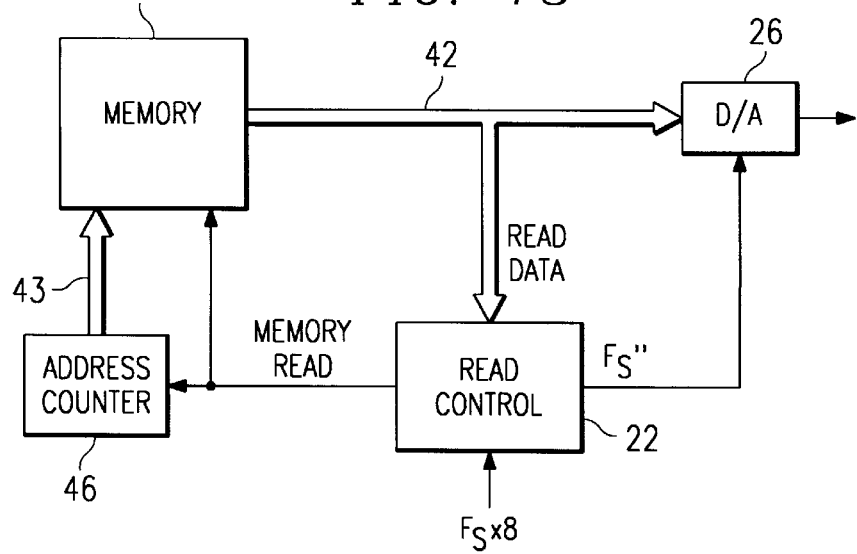
FIG. 13 is a block diagram of a specific embodiment decode circuit.

FIG. 13 shows a block diagram of the specific embodiment circuit for which the read control details will be discussed. The circuit is similar to the circuit illustrated in FIG. 6.

Figure 14A:
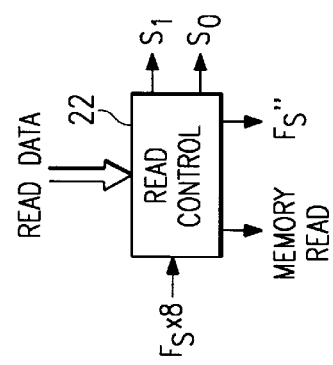
FIGS. 14a and 14b are block diagrams of read control circuit.

FIG. 14a illustrates the read control circuit 22 as a block to show the inputs and outputs. The read control circuit 22 has the read data digital word input and also a clocking signal at a frequency which is eight times the highest possible sampling frequency (i.e., $F_s \times 8$). The read control circuit 22 generates frequency select signals $S_1$ and $S_0$ (which may or may not be required by other elements in the circuit), a memory read signal and a clocking signal $F_s''$ to operate D/A converter 26.

Figure 14B:
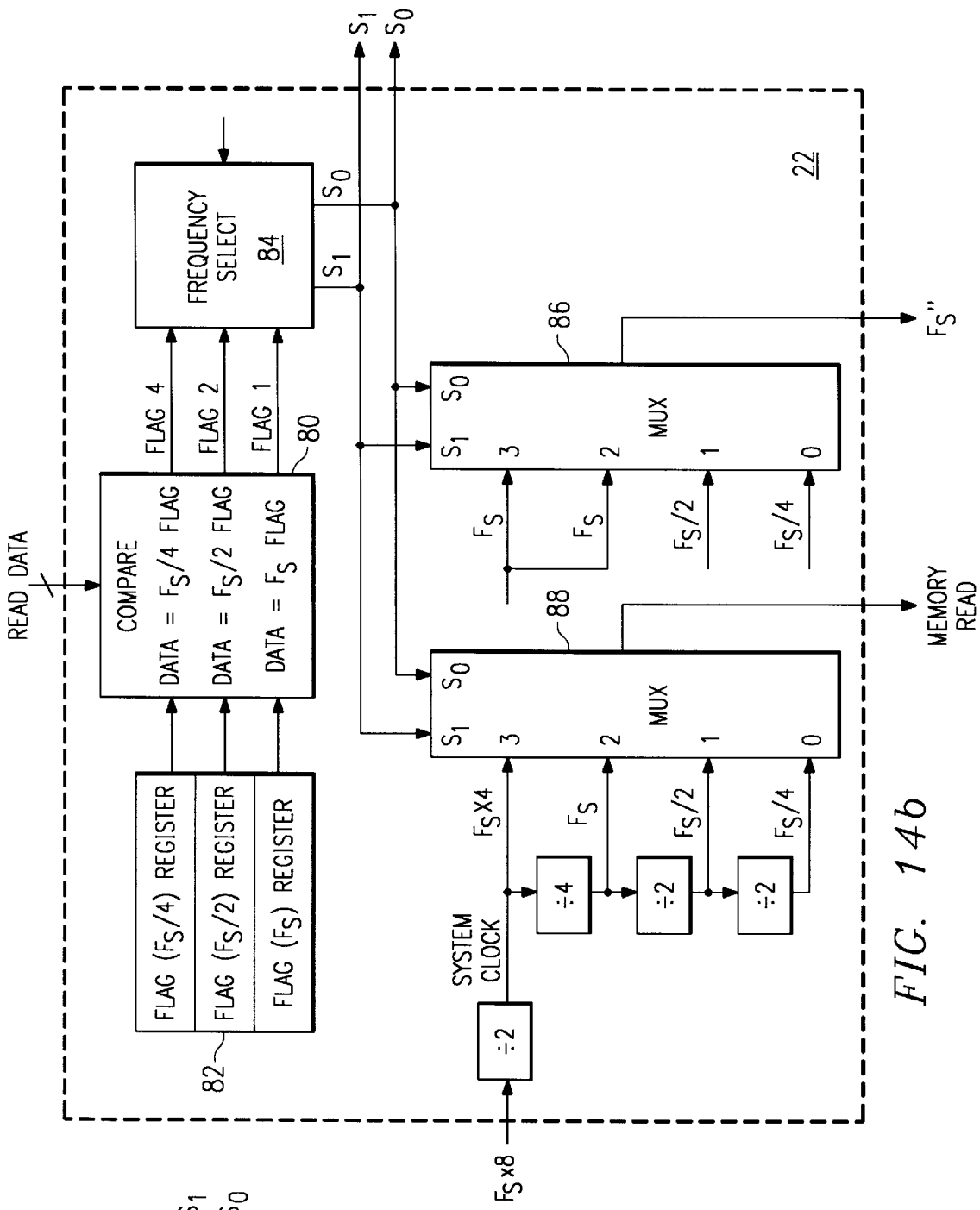

The details of a preferred embodiment read control circuit 22 are illustrated in FIG. 14b. The digital word is coupled from the READ DATA input to comparator 80. The comparator 80 comprises circuitry for determining whether a control word is present. In this embodiment, flag register 82 has the three possible flag values flag($F_s/4$), flag($F_s/2$) and flag($F_s$) which correspond to changes to the respective sampling rates. If one of the flag values is equal to the READ DATA word then one of the flag outputs flag4, flag2 or flag1 will be set. For example, if the READ DATA matches flag($F_s/2$) in the flag register 82, then flag2 will be set to "one" and flag1 and flag4 will be set to "zero". Other schemes for controlling the code word can also be used, as previously discussed.

Figures 15, 16:
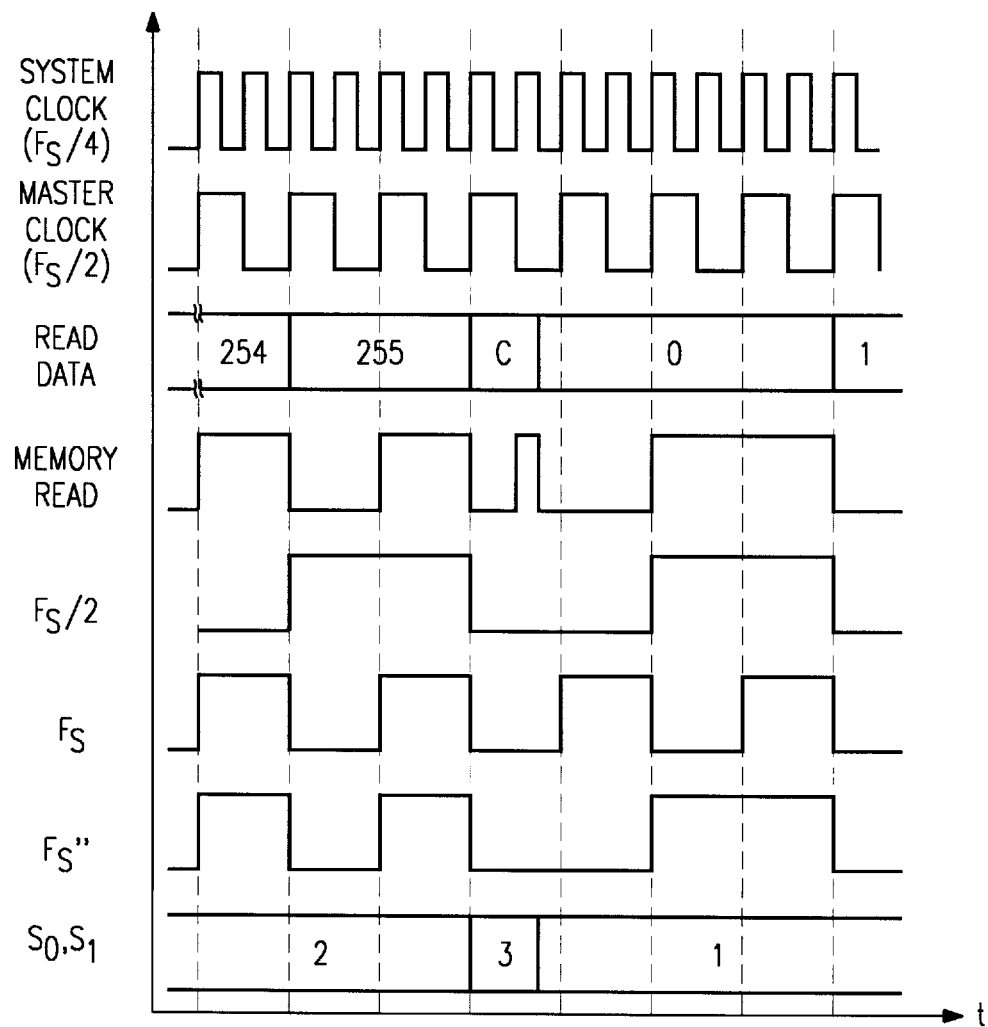
FIG. 15 is a state machine table for the frequency select state machine within FIG. 14b.
FIG. 16 is a timing diagram to demonstrate the operation of the preferred embodiment read control circuit.

The flags are coupled to frequency select circuit 84. The frequency select circuit 84 comprises a state machine to generate the frequency select signals $S_0$ and $S_1$. The state table corresponding to frequency select circuit 84 is shown in FIG. 15. The frequency select signals $S_0$ and $S_1$ are coupled to multiplexers 86 and 88 which select the appropriate signals for memory read and the D/A converter clocking signal $F_s''$.

The read control state machine 22 purges control and digital signal data words from the read data stream and generates the appropriate memory read and data conversion control signals. If digital interpolation filters (as shown in FIG. 4) are used for the purpose of high quality or constant rate digital output, the output signals $S_0$, $S_1$ may be used to select the respective filter output pertaining to the current effective sampling rate.

The preferred embodiment employs a digital state machine for all sampling frequency division and control signal generation. The functional representation shown in FIG. 14*b*, however, uses a multiplexer and comparator for the purpose of functional illustration. The compare function in comparator 80 is a simple bit-by-bit exclusive OR type which compares values received from memory 16 to known control words stored in the flag registers 82. If a new data value read from memory is represented by a value in the flag register, the appropriate flag output signal corresponding to the value in the flag register is set. As indicated in the select state machine table of FIG. 15, the $S_1$, $S_0$ outputs then transition to the 1,1 binary state followed by the select state corresponding to the new effective sample frequency. the single ($F_s \times 8$) cycle transition to 1,1 selects the system clock signal multiplexed to the 'memory read' output which causes an additional read operation to be performed to fetch the first signal data value after the change in effective sampling frequency.

A timing diagram illustrating the operation of the read control circuit is shown in FIG. 16. As illustrated by the figure, a read control word C was detected between sample numbers 255 and sample number 0. An extra memory read pulse was generated to read this word but the word was not converted by D/A 26 since the conversion control signal $F_s''$ did not include the additional pulse.

Figure 17A:
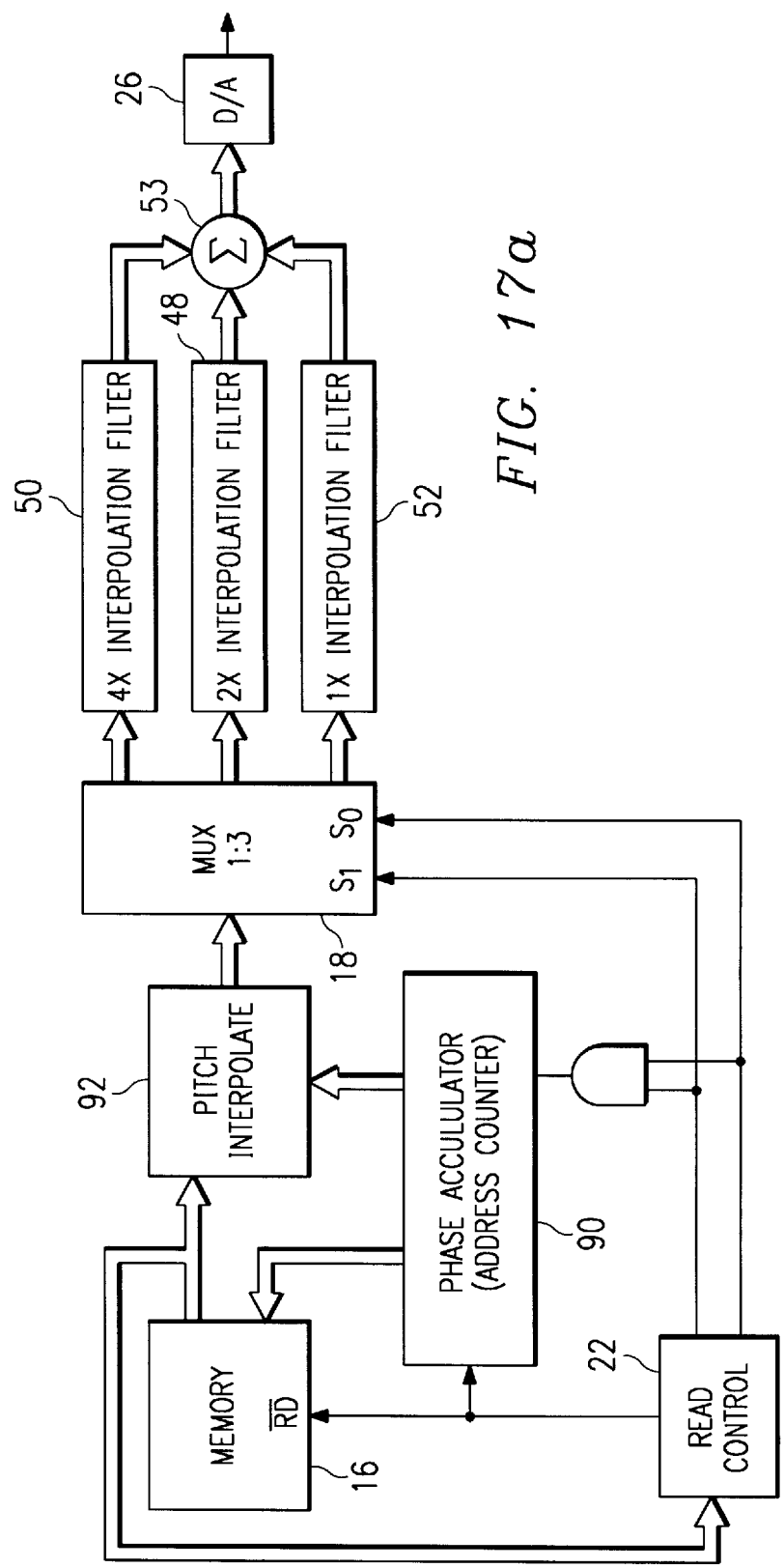

The present invention may be used with pitch interpolated systems. An example of a decode circuit which is capable of pitch interpolation is illustrated in FIG. 17*a*. FIG. 17*b* illustrates the details of one embodiment phase accumulator.

In one aspect, the adaptive sampling decode process, as illustrated in FIG. 4*a* for example, can support music synthesis applications with the inclusion of pitch interpolation and enhanced address generation logic as shown in FIGS. 17*a* and 17*b*.

The embodiment of FIG. 17*a* is similar to that of FIG. 4*a*. A phase accumulator 90 and a pitch interpolation circuit 92 are also included in this circuit. The phase accumulator 90 takes on the now more complex address generation function that was performed by address counter 46.

The address generation logic (labeled with reference numeral 46 in prior figures) takes on the functionality of what is commonly known as a phase accumulator 90. The sample address accumulator 94 has both integer and fractional content. The integer portion contains the actual address which is connected to the read address on the memory block 16. To be compatible with adaptive sampling, the phase accumulator shown is modified to include a 2:1 multiplexer 96 and a unit register 98. The unit register 98 simply contains the value of 1 to serve as a unit increment to the integer portion of the sample address accumulator 94 for control word reads. The pitch register 100 contains the normal address increment (containing integer and fractional representation) which is added to the sample address accumulator 94 each memory read cycle. The sample address accumulator 94 receives its input from summation circuit 102. The summation circuit 102 has inputs from Z-transform circuit 104 and multiplexer 96.

This facilitates simple pitch interpolation by 'playing back' sample data at rates differing from the rate at which the original signal was sampled, yet producing data at the base sampling frequency during a frame within adaptive sampling. The read control logic performs as previously defined with the logical ANDing of the $S_0$ and $S_1$ signals added to serve as the select line for the multiplexer 96 contained in the address generation logic.

This particular embodiment is limited to downward pitch interpolation only since incrementing the address by more than one may cause a control word stored in memory to be skipped. This limitation can be overcome by storing control words at regular intervals and counting address values or other control processes for giving and detecting sampling frequency changes. The pitch interpolation used within this embodiment is of the table look-up/linear interpolate type as shown in FIG. 18.

The pitch interpolation circuit of FIG. 18 includes a Z-transform circuit 102 which receives the data samples at an input. The data samples as well is the output of the Z-transform circuit 102 are coupled to summation circuit 104. The output of summation circuit 104 is coupled to buffer 106. The signal output from buffer 106 is added to the signal output from Z-transform circuit 102 in summer 108.

Figure 19:
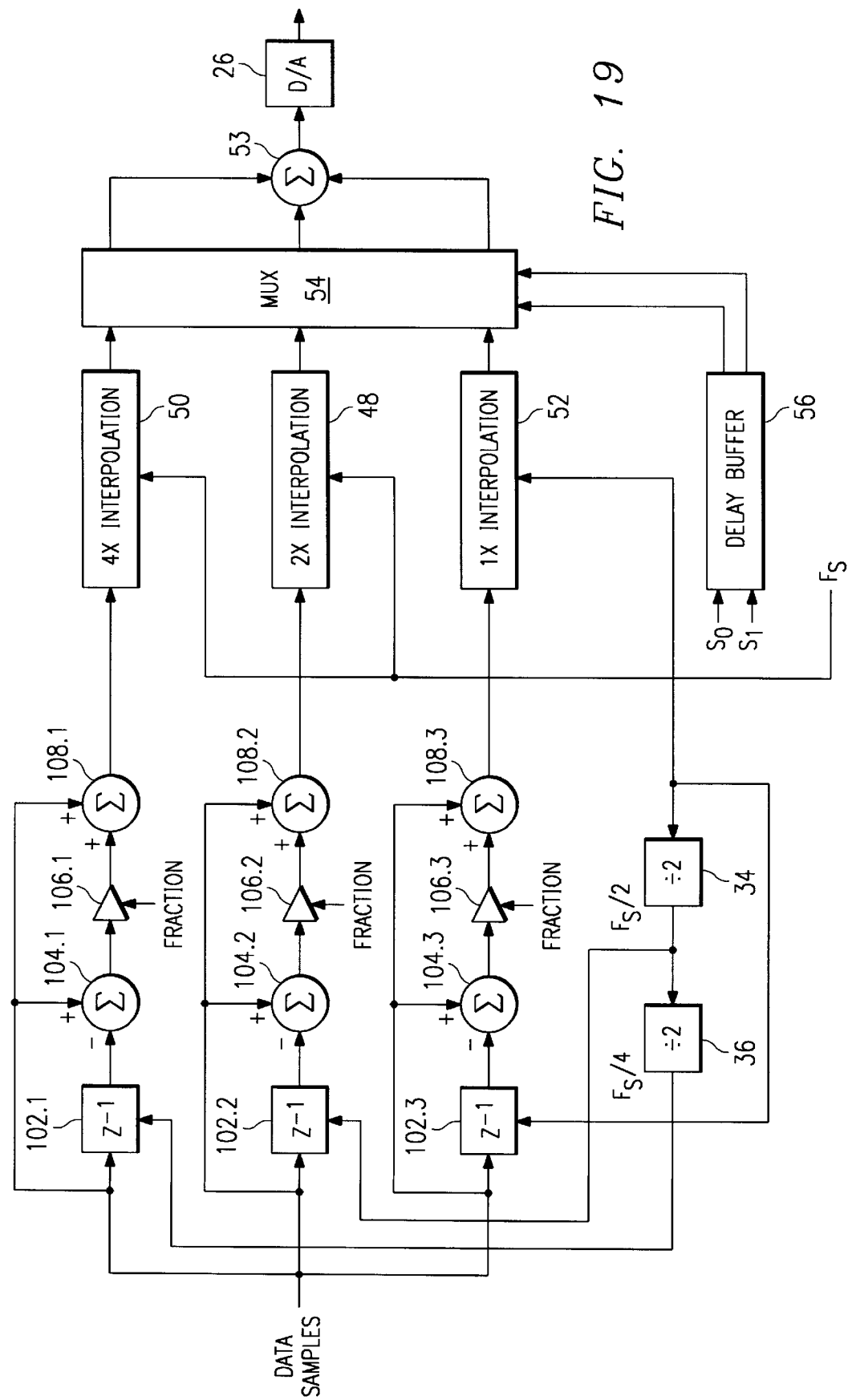
FIG. 19 is a schematic diagram of a portion of a pitch interpolated embodiment circuit.

A schematic representation of a circuit including this embodiment pitch interpolation circuit is illustrated in FIG. 19.

The encode/decode process of the present invention works very well in the application of music synthesis. The process of wavetable look-up with linear interpolation is widely employed in contemporary music synthesis systems and is often a major computational overhead. The amount of computation for the wavetable lookup with interpolation is reduced proportionally to the active sample frequency in the context of the decode process described herein. The computations are executed at each of the corresponding receive data rates, equal to, one-half of, and one-fourth of the output frequency of the D/A converter, which is constant at the maximum sampling frequency. Since the number of wavetable look-ups and interpolations done for each of the effective sampling rates can be extensive, (e.g. 32 "digital oscillators" for each output interpolation filter), the overhead required for the 2x and 4x output interpolation filters is significantly less than the CPU or computational support saved by running the digital oscillators at the reduced effective sampling rates. The digital oscillator circuits shown in FIG. 19 represent the summation of many such structures which compute output values within each sample period for each of the three effective sampling rates shown. As previously discussed, the process may contain more or fewer than three discrete sample rate channels. Only three sampling rates are indicated in the figures for the sake of example.

The present invention may be utilized in a number of applications. Two of these applications will be described with reference to FIGS. 20 and 21.

Referring now to FIG. 20, an application which uses a host memory for sample storage is illustrated in block diagram form. The circuitry of the present invention may be incorporated into a PC system using an expansion card 102. A digital signal processor (DSP) 104 is included on the board. In the preferred embodiment, the encode and decode process is performed within DSP 104. A peripheral bus interface 106 is coupled to the DSP 104. The peripheral bus interface 106 is used to interface with the audio coder/decoder (codec) 110. The codec 110 may comprise analog-to-digital converter 12 and digital-to-analog converter 14. A DMA (direct memory access) engine and/or host interface circuit 108 is also coupled to DSP 104 to interface with the PC and control the memory access. Memory circuit 112 is also included on the expansion card 102. As illustrated in FIG. 20, the DSP 104, peripheral bus interface 106, and DMA engine and/or host interface circuit 108 may all be included on a single chip. Other configurations are also possible.

The PC expansion card 102 is coupled to the rest of the hardware in the system by PC expansion bus 114. The host memory 116 is also coupled to the bus 114. In the preferred embodiment, the digital samples are stored in the host memory 116. In other words, host memory 116 serves the function of memory unit 16 of the previous figures.

The high cost of high quality sampled sound-based music synthesis is directly related to the large memory requirement needed to support musical instrument samples. For PC audio expansion cards and/or motherboard audio subsystems, the adaptive sampling process enables the use of host PC memory 116 for sample storage for a number of reasons. First, memory bus 114 bandwidth is reduced. Without the this bandwidth reduction, there would not have been enough bandwidth to support sound samples without degrading system performance to the point of making use of host memory impractical. In addition, the sample data storage requirements are reduced, which decreases cost.

The DSP 104 addresses sound sample data via DMA engine 108 or other hardware interface to the PC expansion or PC local bus 114. The adaptive sampling encode/decode process which is embodied with the DSP subsystem can optionally reside in a host microprocessor subsystem (with SRAM as typical personal computer cache memory). In FIG. 20, DSP 104 becomes a CPU and SRAM 112 becomes a cache memory. The audio codec 110 performs both the analog-to-digital and digital-to-analog conversion.

The present invention can also be utilized in a dedicated sample memory as illustrated in FIG. 21. The RAM/ROM block 116 stores audio samples which have been encoded by the adaptive sampling process. This reduces the amount of memory required for sound sample storage without a reduction in sound quality.

Each of these applications has been described in conjunction with audio sampling applications since audio sampling applications exemplify the advantages of the present system. It should be noted, however, that the present invention can be utilized in many other environments. In general, any application which requires the encoding and decoding of analog signals can be benefited by the present invention. In other words, any system which is presently using pulse code modulation or other digital encoding techniques can be converted to use the adaptive sampling technique of the present invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE 1

| Reference Numeral | Element |
|---|---|
| 10 | Encode circuit |
| 12 | A/D converter |
| 14 | Bandwidth detection circuit |
| 16 | Memory unit |
| 18 | Multiplexer |

TABLE 1-continued

| Reference Numeral | Element |
|---|---|
| 20 | Decode circuit |
| 22 | Read control circuit |
| 24 | Interpolation filter |
| 26 | D/A converter |
| 28 | Data bus |
| 29 | Shift Register |
| 30 | Control circuit |
| 32 | Multiplexer |
| 34, 36 | Frequency divider circuit |
| 38 | Address counter |
| 40 | Address bus |
| 42 | Data bus |
| 43 | Address bus |
| 44 | Multiplexer |
| 46 | Address counter |
| 48 | 2x interpolation filter |
| 50 | 4x interpolation filter |
| 52 | Delay circuit (1x interpolation filter) |
| 53 | Summer |
| 54 | Multiplexer |
| 56 | Delay circuit |
| 58, 60 | High pass filter |
| 62, 64 | RMS level detector |
| 66, 70 | Comparator |
| 68, 72 | Register |
| 74 | Frequency divider circuit |
| 76 | Write control circuit |
| 78 | Tri-state bus control circuit |
| 80 | Comparator |
| 82 | Flag register |
| 84 | Frequency Select Circuit |
| 86, 88 | Multiplexer |
| 90 | Phase accumulator |
| 92 | Pitch interpolation circuit |
| 94 | Sample address accumulator |
| 96 | Multiplexer |
| 98 | Unit register |
| 100 | Pitch register |
| 102 | PC expansion card |
| 104 | Digital signal processor |
| 106 | Peripheral interface |
| 108 | DMA engine/host interface |
| 110 | Coder/decoder |
| 112 | Memory |
| 114 | Bus |
| 116 | Memory |

What is claimed is:

1. A method of representing a signal comprising the steps of:

receiving an analog signal having a bandwidth;

determining said bandwidth over a fixed period of time;

comparing said bandwidth with at least one selected threshold bandwidth;

determining a sample rate based upon a result of said comparing step;

comparing said sample rate with an initial sample rate;

if said sample rate is different than said initial sample rate, generating a code word from which said sample rate can be determined, if said sample rate is different than said initial sample rate, storing said code word in a memory unit; and storing a digital representation of said analog signal in said memory unit, said digital representation comprising a selected number of digital words wherein said selected number is determined by said sample rate and wherein each of said selected number of digital words is distinguishable from said code word.

2. The method of claim 1 wherein said step of comparing said bandwidth with a selected threshold bandwidth comprises the step of comparing said bandwidth to a plurality of threshold bandwidths.

3. The method of claim 1 wherein said analog signal comprises an audio signal.

4. The method of claim 1 and further comprising the steps of:

retrieving said code word from said memory unit;

retrieving said selected number of digital words from said memory unit; and regenerating said digital representation of said analog signal from said code word and said selected number of digital words.

5. The method of claim 1 wherein said step of determining said bandwidth comprises determining a bandwidth of said analog signal.

6. The method of claim 1 wherein said step of determining said bandwidth comprises the steps of digitizing said analog signal and determining the bandwidth of said digitized signal.

7. A system for encoding an analog signal having a bandwidth comprising:

an analog-to-digital converter for converting said analog signal to a digital signal comprising a sequence of samples, said analog-to-digital converter including a digital signal output;

a bandwidth detection circuit coupled to said digital signal output of said analog-to-digital converter, said bandwidth detection circuit for determining said bandwidth and comparing said bandwidth with a selected threshold bandwidth and generating a control signal based on a result of said comparison;

a memory circuit for storing selected ones of said sequence of samples wherein said selected ones are selected based upon said control signal, said memory circuit including a data input operatively coupled to said digital signal output of said analog-to-digital converter.

8. The system of claim 7 and further comprising a shift register coupled between said analog-to-digital converter and said memory circuit.

9. The system of claim 7 wherein said bandwidth detection circuit comprises:

a high pass filter with an input coupled to said digital signal output of said analog-to-digital converter;

a signal detector with an input coupled to an output of said highpass filter; and a comparator with an input coupled to an output of said signal detector, said comparator generating a frequency select signal.

10. The system of claim 9 and further comprising circuitry for receiving a plurality of clocking signals, each said clocking signals at a different frequency, and also receiving said frequency select signal, said circuitry outputting a clocking signal at a selected frequency.

11. The system of claim 10 wherein said circuitry for receiving comprises a multiplexer.

12. A circuit comprising:

an analog-to-digital converter including a signal input and a clocking input and a digital output;

means for generating a first frequency clocking signal coupled to said clocking input of said analog-to-digital converter;

a bandwidth detection circuit with a data input coupled to said digital output of said analog-to-digital converter, said bandwidth detection circuit including a frequency select output;

a multiplexer with a select input coupled to said frequency select output, said multiplexer generating a selected sample rate clocking signal;

an address counter for receiving said selected sample rate clocking signal at an increment input, wherein an output of said address counter is coupled to an address bus; and a random access memory circuit with an address input coupled to said address bus and a data input coupled to said digital output of said analog-to-digital converter.

13. The circuit of claim 12 and further comprising:

a first frequency divider circuit with an input for receiving said first frequency clocking signal, said first frequency divider circuit generating a second frequency clocking signal, wherein said selected sample rate clocking signal is selected between said first and second frequency clocking signals.

14. The circuit of claim 13 wherein said second frequency clocking signal has a frequency which is half that of said first frequency clocking signal.

15. The circuit of claim 13 and further comprising:

a second frequency divider circuit with an input for receiving said second frequency clocking signal, said second frequency divider circuit generating a third frequency clocking signal, wherein said selected sample rate clocking signal is selected from between said first, second and third frequency clocking signals.

* * * * *